US008487367B2

(12) United States Patent  
Kellam (10) Patent No.: US 8,487,367 B2  
(45) Date of Patent: Jul. 16, 2013

(54) PLANAR MOSFET WITH TEXTURED CHANNEL AND GATE

(75) Inventor: Mark D. Kellam, Pittsboro, NC (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/513,089

(22) PCT Filed: Nov. 24, 2010

(86) PCT No.: PCT/US2010/058069
§ 371 (c)(1),
(2), (4) Date: May 31, 2012

(87) PCT Pub. No.: WO2011/068737
PCT Pub. Date: Jun. 9, 2011

(65) Prior Publication Data
US 2012/0286330 A1 Nov. 15, 2012

Related U.S. Application Data

(60) Provisional application No. 61/265,690, filed on Dec. 1, 2009.

(51) Int. Cl.
*H01L 29/66* (2006.01)
(52) U.S. Cl.
USPC ........... 257/329; 257/330; 257/345; 257/401; 257/E29.267; 438/212

(58) Field of Classification Search
USPC ... 257/329, 330, 345, 401, E29.267; 438/212
See application file for complete search history.

(56) References Cited

U.S. PATENT DOCUMENTS

| | | | |
|---|---|---|---|
| 6,034,410 A | 3/2000 | Chan et al. ................. 257/510 |
| 6,133,106 A | 10/2000 | Evans et al. ................ 438/299 |
| 7,164,183 B2 | 1/2007 | Sakaguchi et al. ........... 257/499 |
| 7,517,807 B1 * | 4/2009 | Tucker et al. ............... 438/739 |
| 2006/0084232 A1 | 4/2006 | Grupp et al. ................ 438/291 |
| 2007/0069300 A1 | 3/2007 | Cheng et al. ............... 257/368 |
| 2007/0117284 A1 | 5/2007 | Imai et al. .................. 438/151 |
| 2009/0174001 A1 | 7/2009 | Lee et al. ................... 257/368 |

OTHER PUBLICATIONS

PCT Search Report and the Written Opinion dated Jul. 28, 2011 re Int'l Application No. PCT/US2010/058069. 9 pages.

* cited by examiner

*Primary Examiner* — Tu-Tu Ho
(74) *Attorney, Agent, or Firm* — Mahamedi Paradice Kreisman LLP; Lance M. Kreisman (57) ABSTRACT

A semiconductor device is disclosed that includes a semiconductor substrate having a channel region and respective source and drain regions formed on opposite sides of the channel region. The channel region includes at least one pore. A gate is formed on the semiconductor substrate between the source and drain regions and includes at least one pin received by respective ones of the at least one pore. A dielectric layer is disposed between the gate and the semiconductor substrate.

27 Claims, 9 Drawing Sheets

PLANAR MOSFET WITH TEXTURED CHANNEL AND GATE

CROSS-REFERENCE TO RELATED APPLICATIONS/TECHNICAL FIELD

Pursuant to 35 U.S.C. §365, this application claims priority from International Application No. PCT/US2010/058069, published as WO 2011/068737 A2 on Jun. 9, 2011, which claims priority from U.S. Provisional Application No. 61/265,690, filed Dec. 1, 2009 and entitled "PLANAR MOSFET WITH TEXTURED CHANNEL AND GATE". International Application No. PCT/US2010/058069 and U.S. Provisional Application No. 61/265,690 are hereby incorporated by reference in their entirety.

The disclosure herein relates to semiconductor devices and more particularly to field effect transistor devices and associated methods of manufacturing those devices.

TECHNICAL FIELD

The disclosure herein relates to semiconductor devices and more particularly to field effect transistor devices and associated methods of manufacturing those devices.

BACKGROUND

Semiconductor device technology continues to scale to ever decreasing feature sizes. For metal-oxide semiconductor field-effect transistor (MOSFET) devices, the channel length may at times reduce to a level where the influence of the drain on device operation begins to compete with the influence of the gate. Under worst case conditions, a drain region may have the ability to turn the device on, without any gate voltage, or prevent the device from turning off. Devices that exhibit channel current not controlled by the gate electrode are symptomatic of a problem often referred to as the short channel effect.

Those skilled in the art have employed a variety of mitigation measures to address the short channel effect, including thinning the respective drain and source regions, and devising intricate finned transistor structures. While beneficial for their intended purposes, conventional ways to address the short channel effect often result in significant power dissipation or manufacturing cost.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Semiconductor devices and methods are disclosed herein that mitigate short channel effects without sacrificing power efficiency and/or electron mobility. One embodiment of a semiconductor device in accordance with the disclosure herein includes a semiconductor substrate having a channel region, and respective source and drain regions formed on opposite sides of the channel region. The channel region includes at least one pore. A gate is formed on the semiconductor substrate between the source and drain regions and includes at least one pin received by respective ones of the at least one pore. By minimizing short channel effects with the semiconductor device structures described herein, smaller feature sizes and higher circuit speeds may be attained while dynamic energy dissipation can be reduced.

In a further embodiment, the semiconductor device is manufactured in accordance with cost-effective processes to minimize manufacturing complexity. In particular, a unique texturing technique allows for the pore pattern to self-organize, effectively rendering unnecessary any lithography steps to initially create the pattern. One specific embodiment employs an anodization process acting on an aluminum layer to form the pore pattern.

Figure 1A:
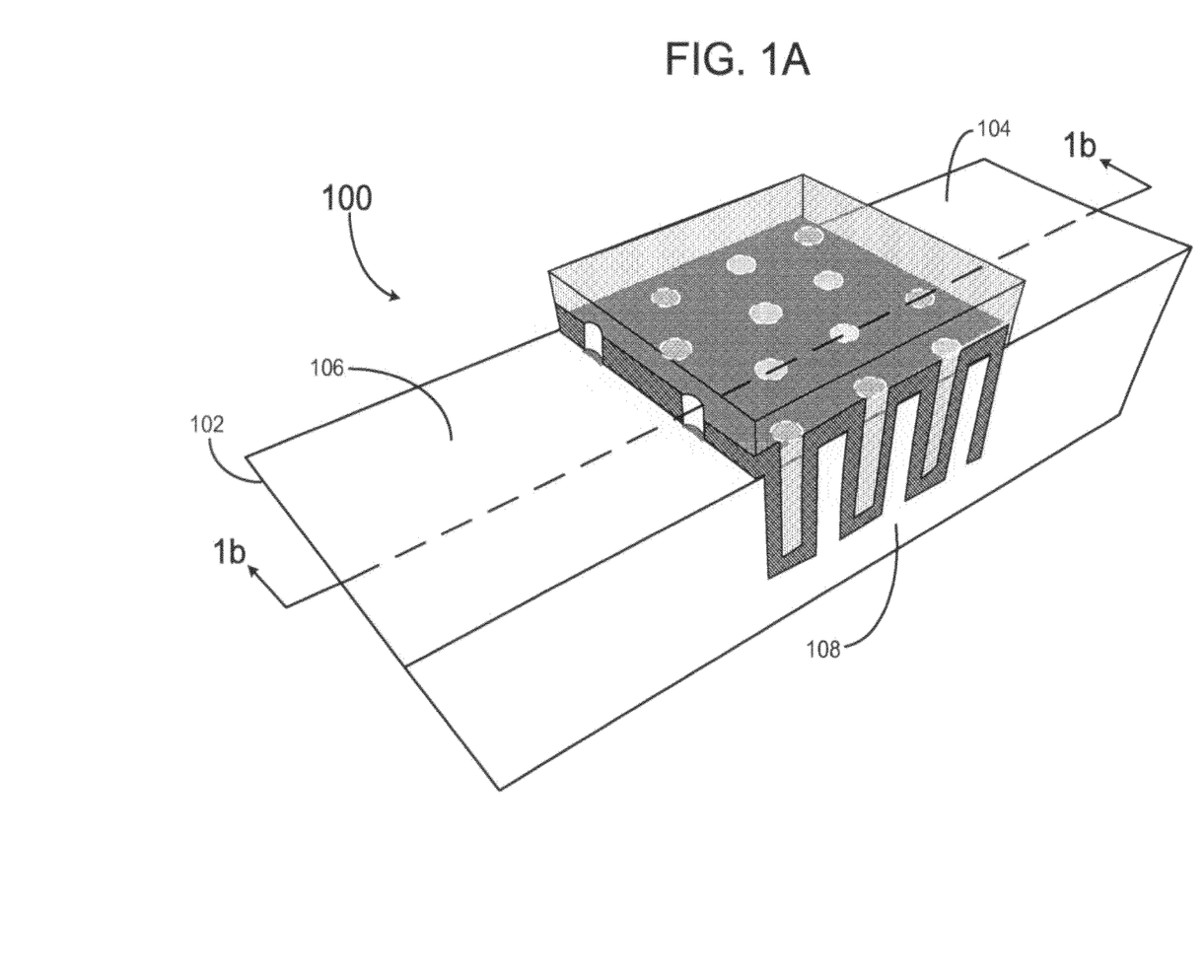
FIG. 1a illustrates a partial three-dimensional view of a planar semiconductor device in accordance with an embodiment of the disclosure.

FIG. 1a illustrates a three-dimensional view of a planar metal-oxide-semiconductor field-effect transistor (MOSFET) 100 according to one embodiment of the disclosure herein. The device generally includes drain and source regions 104 and 106 (FIG. 1b) formed in a bulk semiconductor substrate 102. The drain and source regions are heavily doped to a polarity opposite to that of the bulk substrate, with either a P-type dopant (such as boron) or an N-type dopant (such as phosphorous), depending on whether the device is to be an P-channel or N-channel device. Interposed between the source and drain regions is a channel region 108.

Figure 1B:
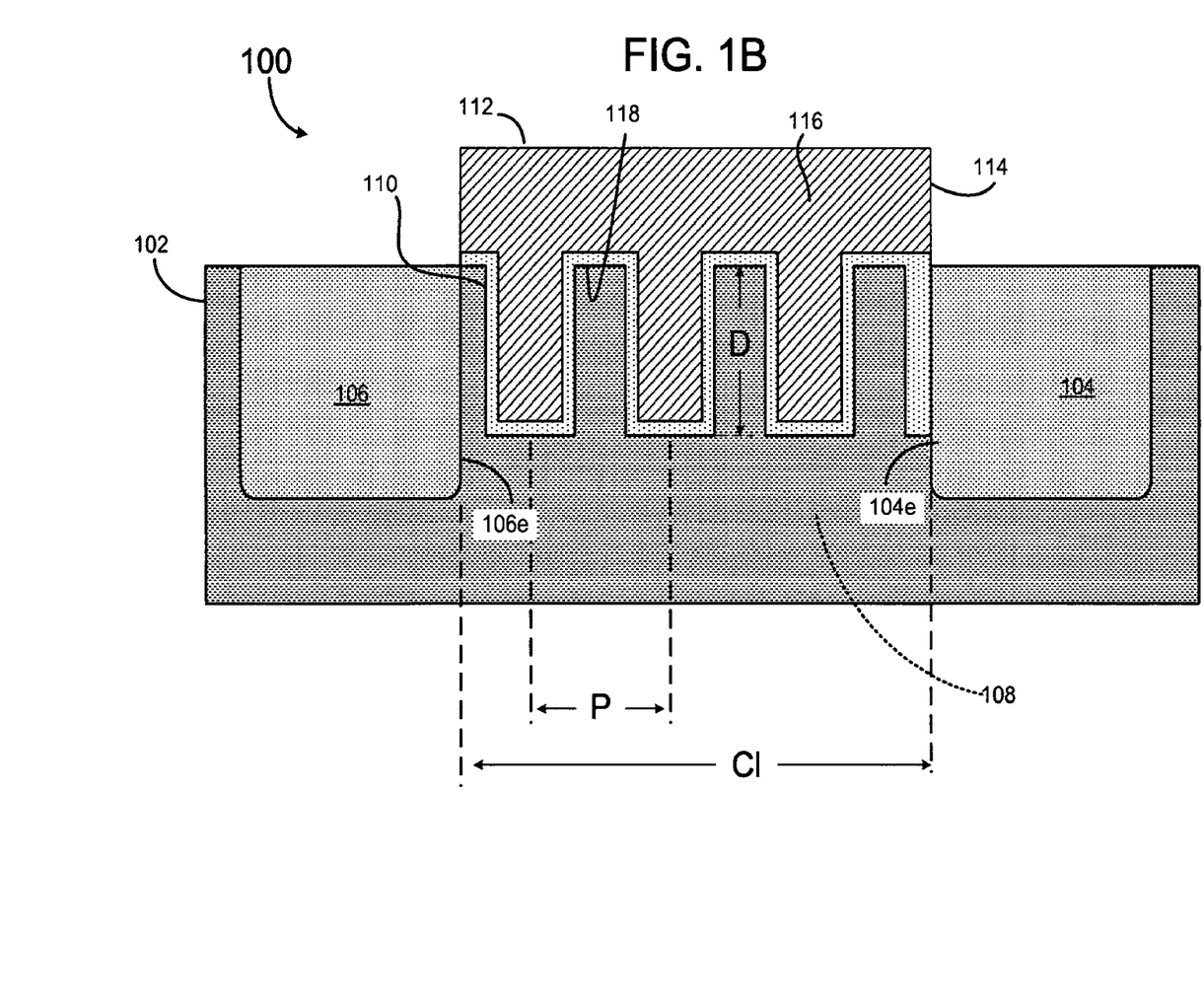
FIG. 1b shows a cross-sectional view of the planar semiconductor device of FIG. 1a, along line 1b-1b.

Referring now to FIG. 1b, which illustrates a cross-sectional view of the MOSFET device 100, the channel region 108 includes a texturized surface formed with at least one, but preferably a plurality of pores 110 that cooperate with a unique gate structure 112. The pores define an array of openings, such as that shown in FIG. 2 within the channel region. The gate structure is made of a conductive material and includes a planar portion 114 disposed above the channel and a plurality of spaced-apart pins 116 that extend into the plurality of pores. A thin layer of insulating material 118, such as silicon dioxide, insulates the gate structure from the bulk substrate The material forming the gate structure may include highly doped polysilicon or metal. In some instances, a depletion layer can form in a polysilicon gate, proximate the gate dielectric when the transistor channel exhibits an inversion. Employing metal provides not only manufacturing benefits (allowing for lower temperature processes that utilize less energy), but also helps to avoid the poly depletion problem. Metals such as tantalum, tungsten, tantalum nitride are suitable for use as the gate material, especially when used in conjunction with high-k dielectric materials for the insulator layer.

As more fully described below, the porous structure of the channel region 108 and the insulated gate pins 116 are formed by non-lithographic texturing of the bulk silicon surface 102 on a scale that is generally equal to or less than half the channel length of the device. The channel length, illustrated in FIG. 1$b$ by the parameter Cl, may be viewed as the distance between the interior edge 106$e$ of the source region 106 to the interior edge 104$e$ of the drain region 104. As the pore separation "P" approaches the channel length, geometric non-uniformity caused by alignment of the pores to the channel may become a significant source of variance in device behavior. Devices with pore separation less than or equal to half the gate or channel length exhibit device characteristics that can be remarkably insensitive to the pore separation and pore alignment to the gate edge.

For pore separations at or below half the channel length Cl, the gate capacitance and drain currents scale roughly in a linear fashion with the pore depth D. Short channel control may be attained with pore depths as shallow as a fraction of a nanometer, but generally improves as the pore depth increases. This happens because the gate pins that penetrate into the channel act to screen the electric field lines produced by the source and drain charge and terminate on the channel.

While pore separation plays a role in device characteristics for devices having a plurality of pores, benefits in reduced short channel effect may also be realized with gate structures that employ as few as one pin projecting into the channel region. In such circumstances, the diameter of the pin versus the overall channel length will have a larger effect on device predictability.

Referring now to FIG. 3 through 9, one embodiment for making the semiconductor device 100 will now be described. It should be understood that the features shown in the Figures are not necessarily to scale, and some background structure may be omitted for clarity. The method generally reflects steps applied to semiconductor device fabrication to form the pore pattern, described above. This reduces manufacturing costs by eliminating the development of costly lithography steps to carry out the initial patterning of the pores.

Figure 3:
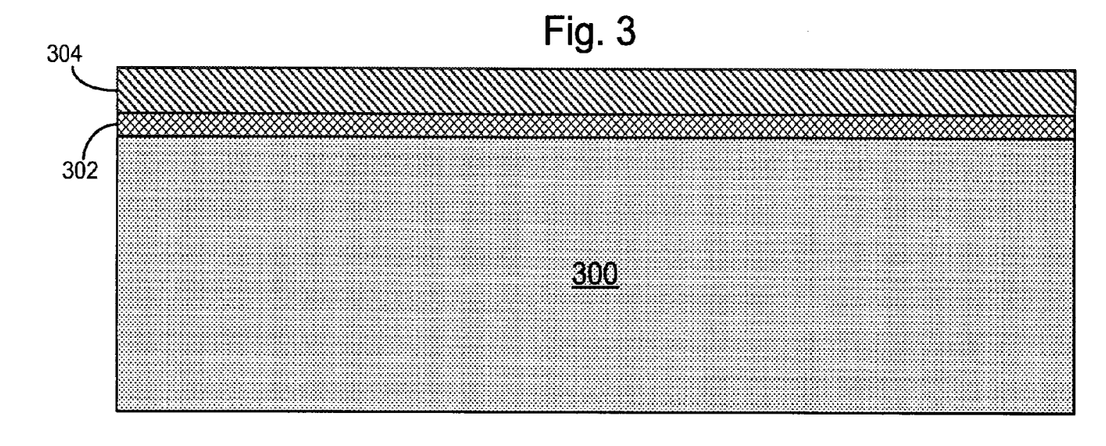
FIG. 3 illustrates a cross-sectional view of a partially manufactured planar semiconductor device of FIG. 1 following an initial deposition process.

FIG. 3 illustrates a partial cross-sectional view of a semiconductor wafer undergoing fabrication, with the illustrated cross-section representing the area corresponding to a single semiconductor device similar to that shown in FIGS. 1$a$ and 1$b$. The wafer begins processing as a bulk silicon substrate 300. A thin layer of dielectric (e.g., silicon dioxide, silicon nitride, and/or silicon oxynitride) 302 on the order of approximately 4-5 nanometers is deposited on the substrate by any of a variety of processes such as phase vapor deposition (PVD) techniques, sputtering, evaporation or chemical vapor deposition processes (CVD) and the like. A metallic layer 304 on the order of around 10-20 nanometers is then deposited over the dielectric layer. The metallic layer 304 preferably comprises aluminum, but may also be formed from any of a variety of metals including, for example, titanium, niobium, tantalum, zirconium, or any combination of the above. These metals, and others, exhibit a desirable characteristic that, when anodized, a layer of oxide emerges with self-organized regular or irregular pore patterns formed in the oxide.

Figure 4:
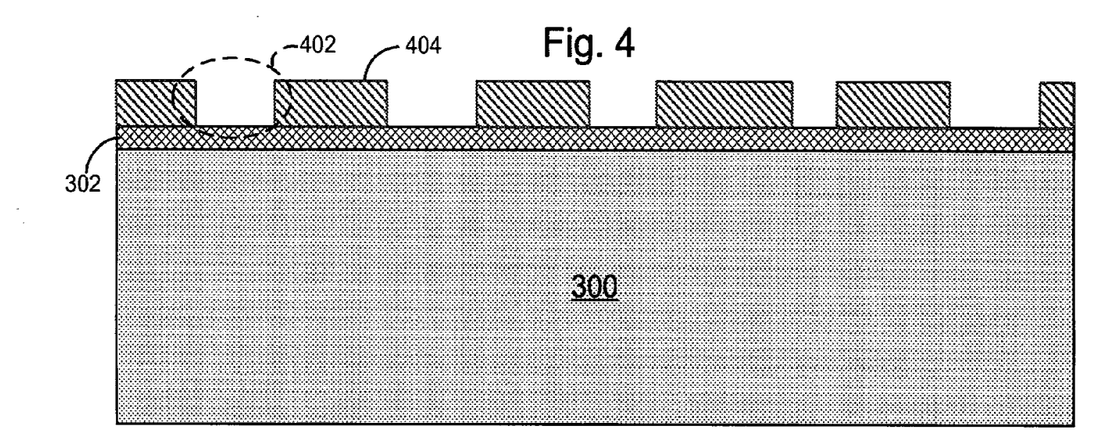
FIG. 4 illustrates a cross-sectional view of the partially manufactured device of FIG. 3 following an anodization process.

Referring now to FIG. 4, the aluminum layer 304 (FIG. 3) is anodized to form an Al2O3 (aluminum oxide) layer in the form of an aluminum oxide membrane that achieves a given pore density and pore size. The anodizing process generally involves first cleaning and annealing the precursor aluminum layer, then electrochemically etching it in a low temperature bath. The length and density of the resulting pores may generally be controlled by specifying certain values of anodizing voltage and time. A desirable parameter involves applying approximately 2V of anodization voltage (via a contact at the edge of the wafer) per nanometer of desired pore spacing.

Figure 2:
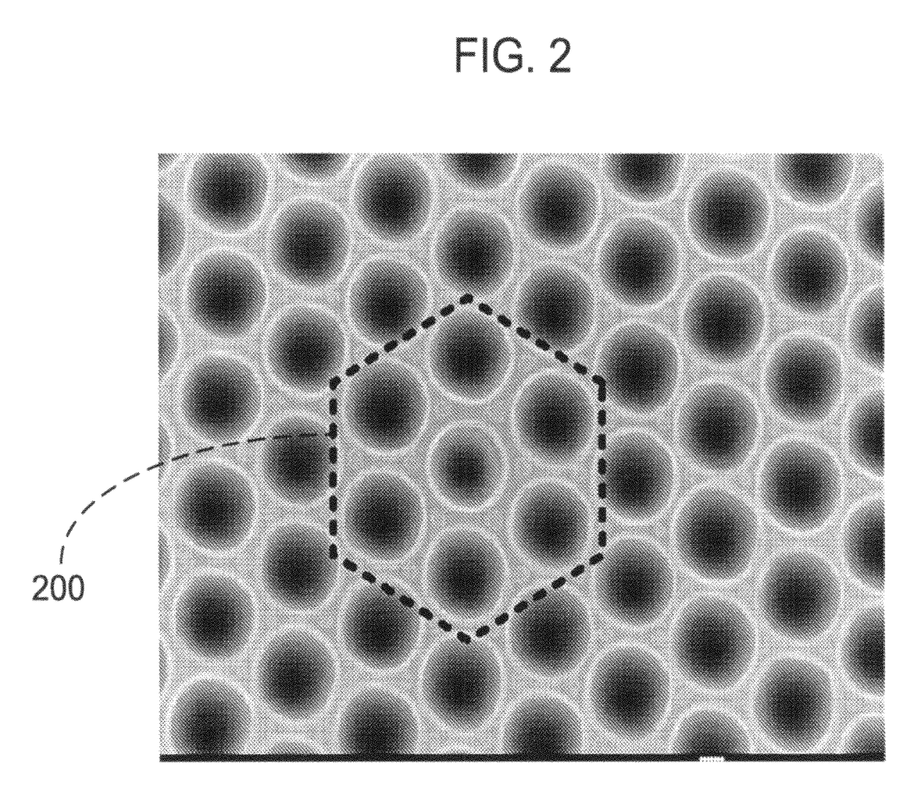
FIG. 2 illustrates a top plan view of a self-organized hexagonal pore pattern formed by anodizing an aluminum layer.

With continued reference to FIG. 4, in the case of aluminum, during anodization, a plurality of pore structures 402 (in phantom, FIG. 4) self-propagate to form a repeating, or periodic hexagonal array 200 (FIG. 2). Referring briefly back to FIG. 2, each pore in the array is generally positioned at a vertex or the center of a hexagon. Pore diameters may range from 10-300 nanometers, with pore densities in the range of $10^8$/cm2-$10^{11}$/cm2. Pore depths are generally greater than 1 nanometer, and may be on the order of between 50 nanometers-hundreds of microns. While the sub-lithographically sized pore openings may generally be cylindrical in shape (note that the back-side of the pores in FIG. 4 are not shown for clarity), they may not necessarily be perfectly formed structures. The use of alternative metallic layers may result in pore patterns that exhibit randomly distributed pores, or patterns that are organized into geometrically arranged triangular, rectangular, trapezoidal or other array shapes.

Referring again to FIG. 4, following anodization, the pores 402 in the aluminum oxide layer 404 may be widened or otherwise modified by chemical techniques such as phosphoric acid etching at a variety of temperatures, or chromic acid etching.

Figure 5:
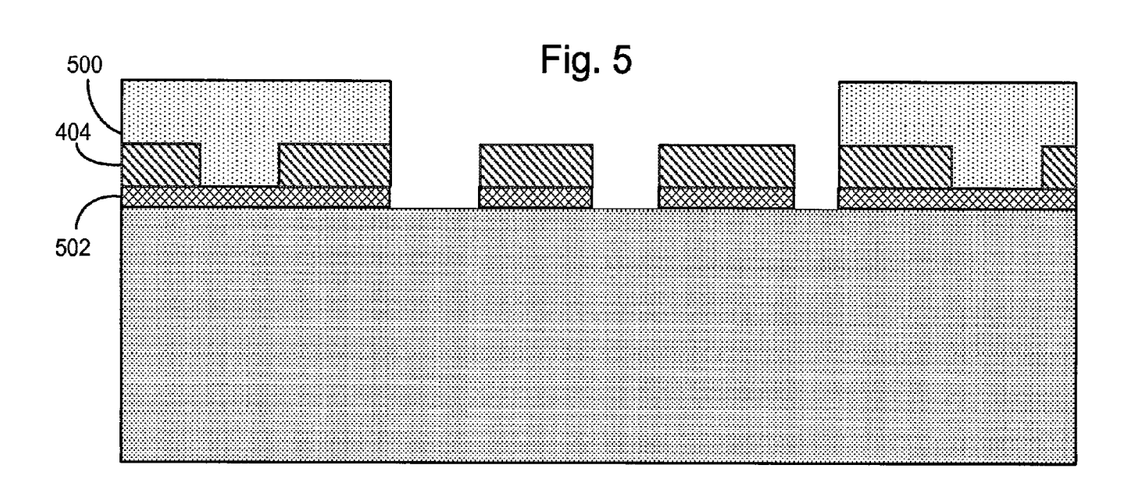
FIG. 5 illustrates a cross-sectional view of the partially manufactured device of FIG. 4 following a first series of etching processes.

FIG. 5 illustrates the result of post-anodizing processing where the anodized aluminum oxide layer 404, shown in FIG. 4, forms a mask for patterning the channel area of the semiconductor device. In one embodiment, the channel area is patterned by applying a photoreactive layer of resist 500 over the aluminum layer. The resist is selectively exposed in the channel region, and removed by a developing process from the exposed regions. The patterning is then followed by a multi-step reactive ion etching (RIE) process. The RIE process is a dry etching technique that employs a chemically reactive plasma to remove the original oxide layer 502 not covered by the resist and the aluminum oxide film. Any undeveloped resist on each side of the channel region is then selectively removed, or stripped, by a suitable strip process. The aluminum oxide is then stripped in hot phosphoric acid.

Figure 6:
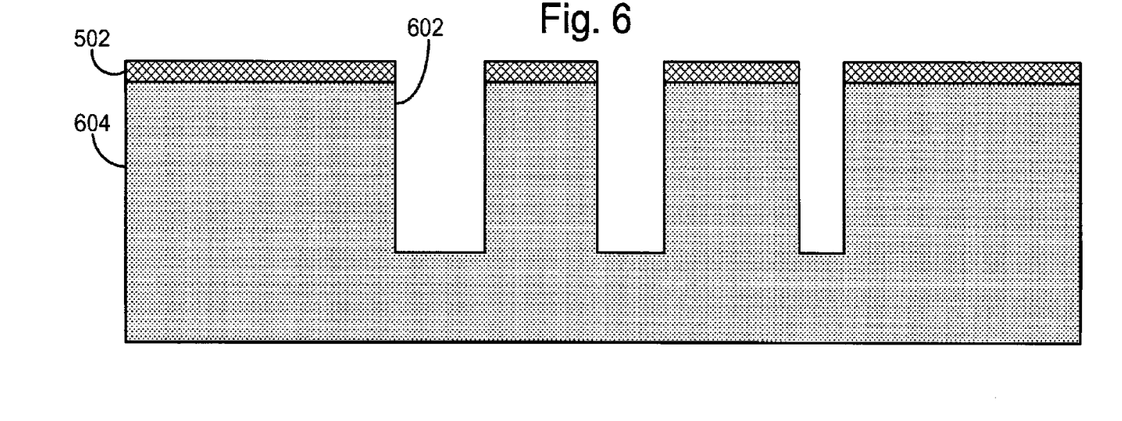
FIG. 6 illustrates a cross-sectional view of the partially manufactured device of FIG. 5 following further etching.
Figure 7:
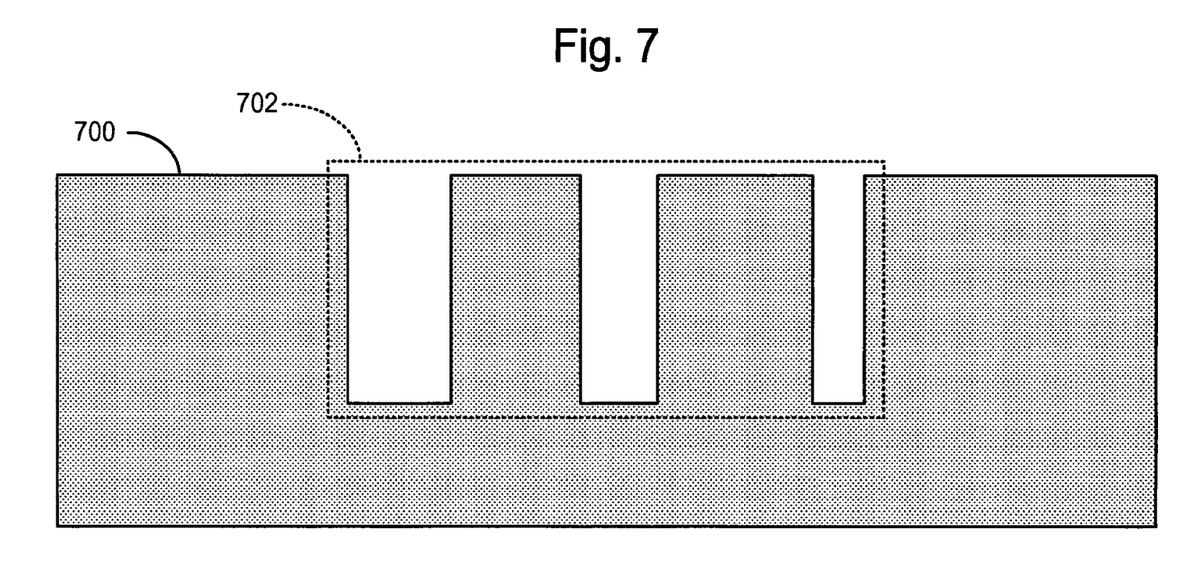
FIG. 7 shows a cross-sectional view of the partially manufactured device of FIG. 6 following a dipping process.

Referring now to FIG. 6, with the pore pattern transferred to the original oxide layer 502, a suitable etch process selectively removes substrate material to form holes 602 in the bulk substrate 604 to the desired depth (from approximately 0.5-20 nanometers deep). Afterwards, the oxide may be removed through, for example, a wet etch process such as a buffer oxide etchant (BOE) dip. The resulting formed bulk silicon 700 with the textured channel region 702 (in phantom) is illustrated in FIG. 7. Alternatively the oxide on the top surface can be left in place at this step. This produces a thicker oxide on top than on the walls of the pore and leads to a reduced vertical electric field.

Figure 8:
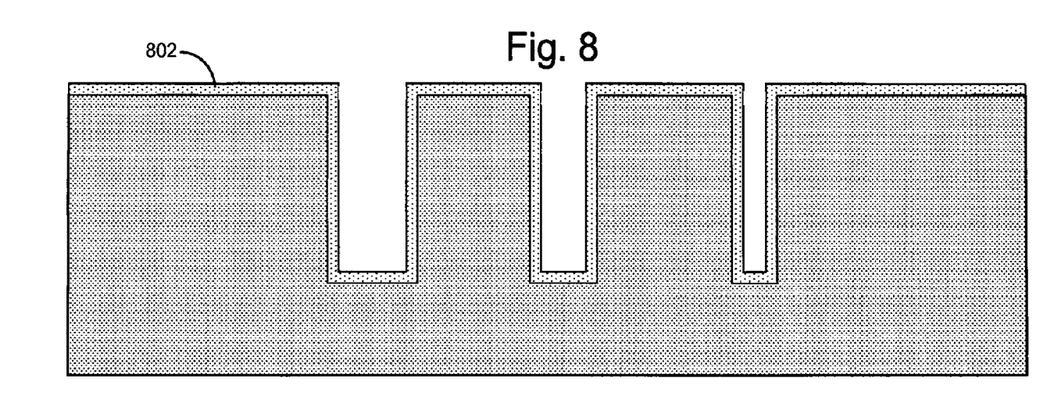
FIG. 8 illustrates a cross-sectional view of the partially manufactured device of FIG. 7 following a gate insulator growth procedure.

Wafer processing continues, as shown in FIG. 8, by growing or depositing a thin layer 802 of suitable gate oxide, which may be thermal oxide, or high-k dielectric material, over the bulk silicon surface 800. Preferably, growing the layer on the order of approximately 1-2 nanometers thick provides acceptable insulating properties.

Figure 9:
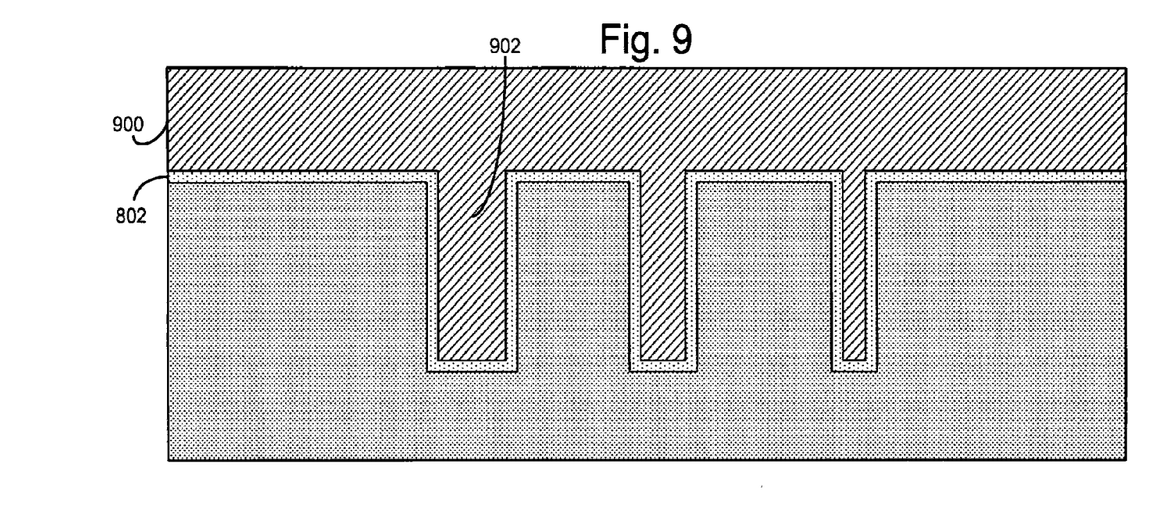
FIG. 9 illustrates a cross-sectional view of the partially manufactured device of FIG. 8 following a gate conductor deposition process.
Figure 10:
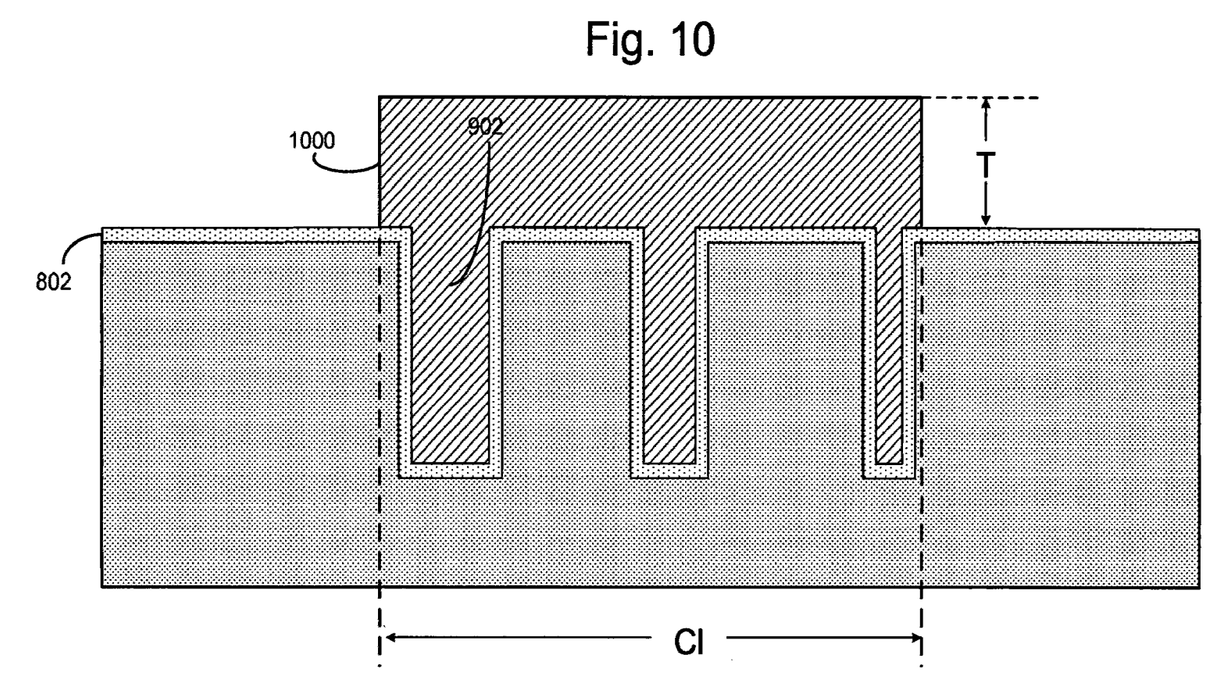
FIG. 10 illustrates a cross-sectional view of the partially manufactured device of FIG. 9 following a further etching process.

Once the oxide layer 802 is formed, the gate material 900 may be deposited, as shown in FIG. 9. The gate material, as described above, may comprise a suitable polysilicon or metallic compound. Each of the opposing sides of the gate layer are RIE etched away, leaving the remaining gate material to define the channel region, as shown in FIG. 10. In one embodiment, the length Cl of the gate 1000 or channel region is on the order of a few tens of nanometers, with a gate thickness T of around 10 to 20 nm. Each pin 902 is preferably around 6-8 nanometers wide (in diameter). Suitable aspect ratios (the ration of the depth to width) for the pins may lie in the range from between about 0.5 to 3.0.

The gate 1000 (FIG. 10) can serve as an implant mask for the source and drain regions. By aligning the source and drain to the already formed gate region, the channel "self-aligns" itself with respect to the source and drain regions during manufacture.

Following formation of the gate, completion of the MOSFET 100 may involve any number of additional processing steps, depending on the complexity of the source/drain junction design. For example, shallow junction extensions may be formed, pocket implants added, raised source and drain regions may be created (with spacers possibly formed to separate the raised regions from the gate), and so forth. Implanting doping material, carrying out diffusing steps, and other fabrication techniques to form the source and gate regions, provide electrical contacts, and otherwise complete the device are well known to those skilled in the art and warrant no further detail herein.

Operation of the semiconductor device described above generally involves applying a voltage to the gate terminal, as is the case with conventional MOSFET devices. However, rather than merely creating a surface inversion region underneath the oxide, the applied voltage on each of the gate pins creates a "bulk inversion" proximate the area in the bulk silicon where the pins project. Clouds of electrons attracted to each pin are able to diffuse between the pins due to pin-to-pin electric field cancellation effects. Upon attaining a certain threshold gate voltage, a voltage applied to the drain contact thus creates an electron current flow. More importantly, however, since more of the gate capacitively couples with the channel, through the gate pins, the influence of the gate is much higher than that of the drain. In fact, gate pins adjacent the drain act to significantly screen much of the electric field generated by the drain from the channel. Optimal effects are observed when the gate pin depths are on the order of the source and drain depths.

The device described above and its associated method of manufacture fit nicely within semiconductor device scaling roadmaps, especially for channel lengths less than 20 nanometers. By mitigating short channel effects with a semiconductor device structure consistent with that described above, scaling down the oxide thickness or increasing channel doping may be reduced. This, in turn, provides the potential for reducing power dissipation without sacrificing circuit speed.

In a further embodiment, the thickness of the oxide that lies between the planar part of the gate electrode and the plane of the original silicon substrate may be increased for the device without suffering poor short channel behavior or significantly reduced drive current. The upper oxide thickness may be double or triple a nominal gate oxide thickness, thereby allowing a substantial reduction in overlap or "Miller" capacitance between the gate and diffusion regions. A 4 nanometer top oxide thickness produces a smaller overlap capacitance than a device that uses, for example, an effective oxide thickness of 1 nanometer.

Further, the pore depth may be adjusted to tailor the drive strength and capacitance of the device. Increasing the drive strength does not necessarily improve the intrinsic device speed, but it may be used to balance the increasingly detrimental effects of interconnect load scaling in many applications.

The unique semiconductor device described above lends itself well to applications that benefit from enhanced electron mobility features. One solution to providing enhanced mobility involves applying a "stressor" material in contact with the bulk semiconductor substrate. The stressor material causes strain within the substrate, effectively expanding the lattice structure of the material. Known by those skilled in the art as "strained silicon", electron and hole mobilities through a strained silicon substrate may be improved by up to a factor of 2. Since frequency is dependent on electron mobility, speed improvements on the order of 10-20% may be experienced.

Figure 11:
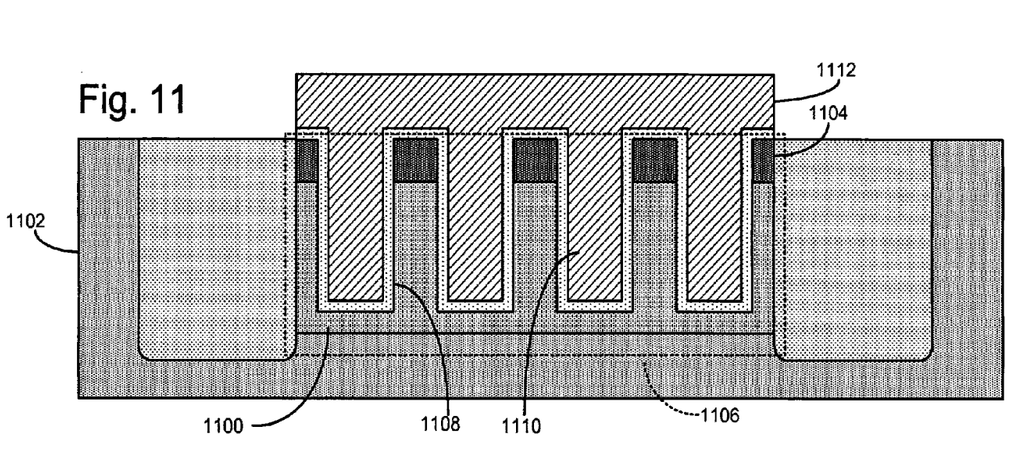
FIG. 11 illustrates a planar semiconductor device that employs strained silicon.

FIG. 11 illustrates one embodiment of an NMOS semiconductor device utilizing a projecting pin gate structure, similar to that described above, and incorporating a "relaxed" SiGe layer 1100 in the substrate 1102. A layer 1104 of "strained" silicon is disposed in the channel region 1106 (in phantom) to complement the relaxed SiGe layer. Methods of achieving relaxation and strain in the material are well known to those skilled in the art, and need no further description. As in the previously described embodiments, respective pores 1108 receive gate pins 1110 projecting into the channel region from a planar layer 1112 of gate material. The strained silicon structure is achievable since the channel region is formed in the bulk substrate. PMOS devices may also be formed similarly.

Figure 12:
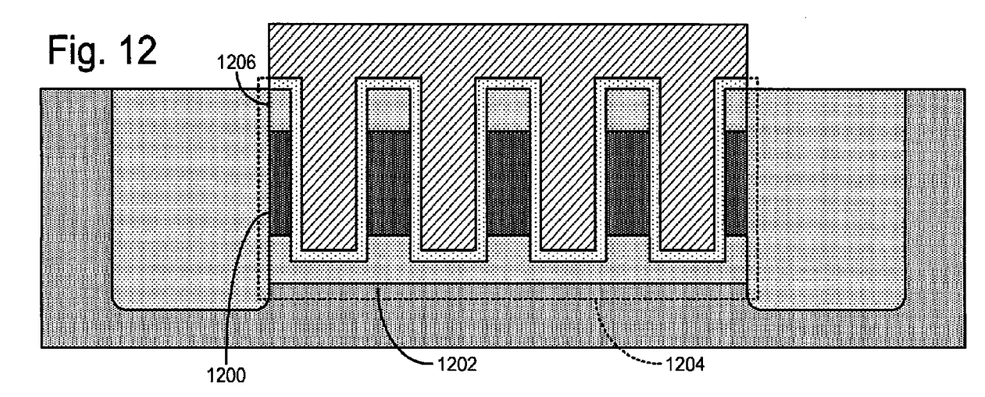
FIG. 12 illustrates a planar semiconductor device similar to FIG. 11, with a sandwiched strained silicon layer.

A further embodiment of an enhanced mobility device for NMOS devices is illustrated in FIG. 12. Similar to the device shown in FIG. 11, a strained silicon layer 1200 abuts a relaxed layer of SiGe 1202 in the channel region 1204 of the device. However, by employing an additional layer of relaxed SiGe 1206, such that the strained silicon is interposed between the two SiGe layers, additional mobility enhancement may be achieved. Moreover, for PMOS devices, SiGe may be added to the source and drain regions (not shown), thus producing compressive channel stress versus the tensile stress used for the NMOS devices. To obtain the benefits of silicon-on-insulator technology, some embodiments may employ a silicon-on-insulator SOI bulk substrate (not shown). In such an embodiment, the pin depth may extend to touch the buried insulator.

Those skilled in the art will appreciate the many benefits and advantages afforded by the apparatus and methods described herein. Significantly, by employing a projecting pin gate structure in a MOSFET device, very short channels are possible without accompanying short channel effects. By mitigating the short channel effect problem, the device herein is able to maintain power efficiency. Moreover, by retaining a planar bulk substrate structure, mobility enhancement structures may be employed to maximize the speed of device operation.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '$\overline{\text{<signalname>}}$') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

I claim:

1. A semiconductor device comprising:
   a semiconductor substrate having a channel region and respective source and drain regions formed on opposite sides of the channel region, the channel region including at least one pore;
   a gate formed on the semiconductor substrate between the source and drain regions, the gate including at least one pin received in respective ones of the at least one pore; and
   a dielectric layer between the gate and the semiconductor substrate.

2. The semiconductor device according to claim 1 wherein the channel region has a channel length, and the at least one pin comprises a plurality of pins that are separated from each other on average by a distance equal to or less than half the channel length.

3. The semiconductor device according to claim 1 wherein the at least one pin has an aspect ratio in the range of 0.5 to 3.0.

4. The semiconductor device according to claim 1 wherein the at least one pin comprises a plurality of pins that form a hexagonal array.

5. The semiconductor device according to claim 1 wherein in the channel, the substrate includes a strained silicon layer disposed on a first relaxed silicon-germanium layer.

6. The semiconductor device according to claim 5 wherein in the channel, the strained silicon layer is sandwiched between the first relaxed silicon-germanium layer and a second relaxed silicon-germanium layer.

7. The semiconductor device according to claim 5 wherein the strained silicon is added to the respective source and drain regions.

8. The semiconductor device according to claim 1 wherein the dielectric layer including a first portion within one of the at least one pore and a second portion outside the at least one pore, the first portion being significantly thinner than the second portion.

9. The semiconductor device according to claim 1 wherein the at least one pin extends from a planar surface of the semiconductor substrate a predetermined depth, the semiconductor device exhibiting a drive strength based at least in part on the predetermined depth.

10. The semiconductor device according to claim 1 wherein the at least one pin extends from a planar surface of the semiconductor substrate a predetermined depth, the semiconductor device exhibiting a capacitance based at least in part on the predetermined depth.

11. The semiconductor device according to claim 1 wherein the semiconductor substrate comprises silicon-on-insulator having a buried insulator layer, and the at least one pin extends from a planar surface of the semiconductor substrate down to touch the buried insulator layer.

12. A method of making a semiconductor device, the method comprising:
  texturing a defined area on a surface of a semiconductor substrate to form at least one pore;
  forming a gate insulator layer on the semiconductor substrate;
  forming a gate having at least one pin received in respective ones of the at least one pore, the gate being separated from the semiconductor substrate by the gate insulator layer; and
  forming a source region and a drain region on opposite sides of the gate.

13. The method according to claim 12 wherein the at least one pore each has a sub-lithographically-sized opening.

14. The method according to claim 12 wherein texturing comprises:
  anodizing a conductive layer to form a mask having a pore pattern; and
  forming the at least one pore corresponding to the pore pattern.

15. The method according to claim 14 wherein the gate structure is formed of metal.

16. The method according to claim 15 wherein the defined area comprises a channel region that includes a channel length, and the at least one pore comprises a plurality of pores, the plurality of pores having a pore separation that is equal to or less than half the channel length and based at least in part on an anodization voltage.

17. The method according to claim 12 wherein the defined area comprises a channel region formed by:
  burying a first layer of silicon-germanium in the substrate layer; and
  straining a silicon layer over the buried layer of silicon-germanium.

18. The method according to claim 17 and further comprising:
  burying a second layer of silicon-germanium in the substrate layer above the strained silicon layer.

19. The method according to claim 12 wherein the insulator layer has a thickness no less than 4 nanometers.

20. A semiconductor device made by a method comprising:
  texturing a defined area on a surface of the semiconductor substrate to form at least one pore;
  forming a gate insulator layer on exposed surfaces of the semiconductor substrate;
  forming a gate structure having at least one pin in respective ones of the at least one pore, the gate structure being separated from the semiconductor substrate by the gate insulator layer; and
  forming a source region and a drain region on opposite sides of the gate structure.

21. The semiconductor device made by the method according to claim 20 wherein the at least one pore each has a sub-lithographically-sized opening.

22. The semiconductor device made by the method according to claim 20 wherein the texturing comprises:
  anodizing a conductive layer to form a mask having a pore pattern; and
  forming the at least one pore corresponding to the pore pattern.

23. The semiconductor device made by the method according to claim 20 wherein the gate structure is formed of metal.

24. The semiconductor device made by the method according to claim 20 wherein the defined area comprises a channel region that includes a channel length, and the at least one pore comprises a plurality of pores, the plurality of pores having a pore separation that is equal to or less than half the channel length and based at least in part on an anodization voltage.

25. The semiconductor device made by the method according to claim 20 wherein the defined area comprises a channel region formed by:
  burying a first layer of silicon-germanium in the substrate layer; and
  straining a silicon layer over the buried layer of silicon-germanium.

26. The semiconductor device made by the method according to claim 25 and further comprising:
  burying a second layer of silicon-germanium in the substrate layer above the strained silicon layer.

27. The semiconductor device made by the method according to claim 20 wherein the insulator layer has a thickness no less than 4 nanometers.

\* \* \* \* \*